US006774724B2

(12) United States Patent
Krvavac

(10) Patent No.: US 6,774,724 B2
(45) Date of Patent: Aug. 10, 2004

(54) RADIO FREQUENCY POWER AMPLIFIER ACTIVE SELF-BIAS COMPENSATION CIRCUIT

(75) Inventor: Enver Krvavac, Lake Zurich, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/301,021

(22) Filed: Nov. 21, 2002

(65) Prior Publication Data

US 2004/0100327 A1 May 27, 2004

(51) Int. Cl.[7] .............................. H03F 3/04; H03F 1/30
(52) U.S. Cl. ....................................... 330/296; 330/290
(58) Field of Search ................................ 330/296, 290, 330/291

(56) References Cited

U.S. PATENT DOCUMENTS 5,307,023 A * 4/1994 Schade, Jr. ................. 330/257
6,046,642 A * 4/2000 Brayton et al. ............. 330/296
6,424,225 B1 * 7/2002 Choi et al. .................. 330/289
6,437,647 B1 * 8/2002 Fowler ....................... 330/288
6,515,546 B2 * 2/2003 Liwinski ..................... 330/296
6,556,082 B1 * 4/2003 Wang et al. ................ 330/288
6,617,928 B2 * 9/2003 Finlay et al. ............... 330/288

* cited by examiner

*Primary Examiner*—Patricia Nguyen
(74) *Attorney, Agent, or Firm*—Valerie M. Davis

(57) ABSTRACT

An active bias compensation circuit for use with a radio frequency ("RF") power amplifier, the RF amplifier having an input (112), an output (116), a first transistor (110), and a plurality of operating performance characteristics responsive to a quiescent operating point established by a bias current in the RF amplifier. The active bias compensation circuit includes: a second transistor (120) operatively coupled to the RF amplifier and having a first, second and third terminal and further configured to have essentially the same electrical and thermal characteristics as the first transistor; and a first circuit (130) coupled between the first and second terminal of the second transistor for causing a desired quiescent operating current to be set and maintained in said RF power amplifier, independent of factors such as temperature and process variation.

13 Claims, 2 Drawing Sheets

200

RADIO FREQUENCY POWER AMPLIFIER ACTIVE SELF-BIAS COMPENSATION CIRCUIT

FIELD OF THE INVENTION

The present invention relates generally to radio frequency (RF) power amplifiers, and more specifically to a circuit for causing a bias current in the RF power amplifier to be set and maintained at a predetermined fixed value.

BACKGROUND OF THE INVENTION

Radio frequency (RF) power amplifiers characterized by a plurality of operating performance characteristics responsive to a quiescent operating point established by a direct current (DC) bias current are used in a wide variety of communications and other electronic applications. These amplifiers are made up of one or more cascaded amplifier stages, each of which increases the level of the signal applied to the input of that stage by an amount known as the stage gain. Ideally, the input to output transfer of each stage is linear, i.e., a perfect replica of the input signal increased in amplitude appears at the amplifier output. In reality, however, all power amplifiers have a degree of non-linearity in their transfer characteristic. This non-linearity adversely affects various amplifier operating characteristics such as gain performance, intermodulation performance and efficiency.

The optimal quiescent operating point of the RF power amplifier and, thereby, the optimal DC bias current is a critical design for optimal linearity in the RF power amplifier. Once the optimal bias current in the RF power amplifier is set, it is desirable to maintain the optimal bias current in the RF power amplifier. However, the bias current typically drifts from its optimal point over time as a function of factors such as temperature variation, process variation, and history of the RF power amplifier.

One technique for maintaining the optimal DC biasing point is referred to as a self-bias technique, in which a portion of the output signal of the RF power amplifier is used as a feedback to adjust the bias point of the amplifier. This self-bias technique adversely affects the performance of the RF power amplifier and is inappropriate for high performance RF power amplifiers.

Another widely practiced technique to maintain the optimal DC biasing point is an active bias tuning technique. This technique can adjust DC biasing points according to process variations of a device, but it cannot adjust the DC biasing points in response to temperature variations and history of the device. In addition, such tuning is expensive and time consuming.

Yet another technique is resetting the biasing points after burning in the device. This technique can often lessen but not eliminate the problem of a DC biasing point drifting as the device ages, but the burning process is time consuming and costly.

A large DC resistance connected in series with the emitter of a bipolar transistor is one technique that may be used to reduce the temperature sensitivity of the transistor. However, the voltage drop across and the power loss in the large resistance adversely affect the RF power amplifier containing the transistor.

Still another technique uses a microprocessor controlled active bias control circuit to periodically reset the DC bias points. However, this technique is complicated and expensive.

Yet another technique is disclosed in U.S. Pat. No. 6,046,642, entitled AMPLIFIER WITH ACTIVE BIAS COMPENSATION AND METHOD FOR ADJUSTING QUIESCENT CURRENT. The technique and circuit disclosed for maintaining the optimal bias current in the RF power amplifier addresses many of the shortcomings of the above prior art. However, this technique requires that the active bias compensation circuit be off-chip from the RF power amplifier, and like the above prior art, this technique does not allow for suppression of RF and baseband energy that may build up on a reference transistor. In addition, the circuit disclosed in U.S. Pat. No. 6,046,642 is not as space efficient, nor as cost effective or as efficient in power consumption as one would desire.

Thus, there exists a need for a simple, space effective, power effective, and cost efficient circuit for adjusting a bias current so that an optimal quiescent operating point is maintained in an RF power amplifier over factors such as temperature variation, process variation, and history of the RF power amplifier, and that performs thermal tracking and suppression of RF and baseband energy as needed, and that will not require any tuning in a manufacturing environment.

BRIEF DESCRIPTION OF THE FIGURES

A preferred embodiment of the invention is now described, by way of example only, with reference to the accompanying figures in which.

DETAILED DESCRIPTION OF THE PREFERRED EMBODIMENT

Figure 1:
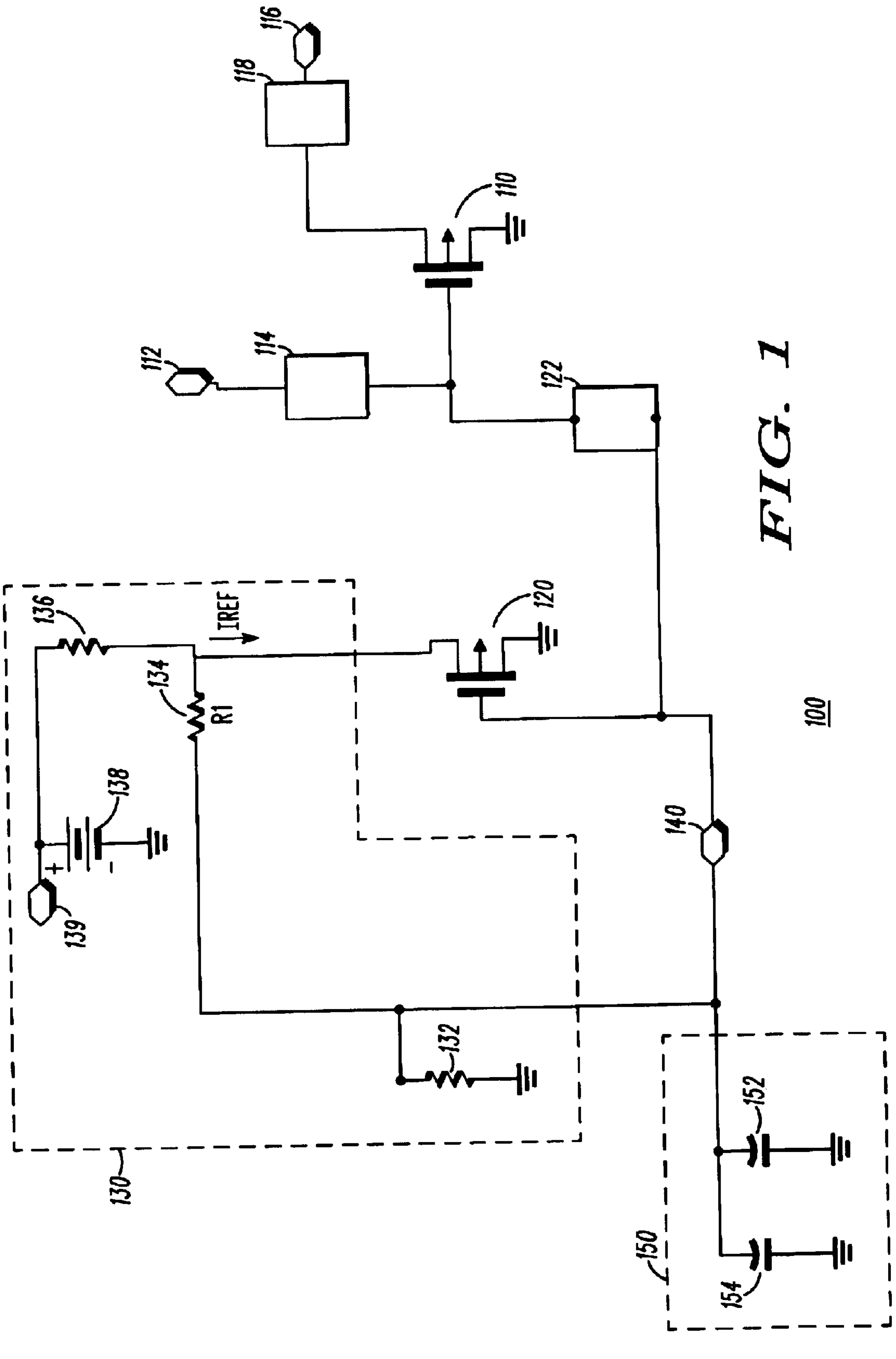
FIG. 1 illustrates one embodiment of an RF power amplifier network in accordance with the present invention.

It will be appreciated that for simplicity and clarity of illustration, elements shown in the figures have not necessarily been drawn to scale. For example, the dimensions of some of the elements are exaggerated relative to each other. Further, where considered appropriate, reference numerals have been repeated among the figures to indicate corresponding elements.

Referring to FIG. 1, there is illustrated a diagram of a radio frequency (RF) power amplifier network 100 according to one embodiment of the present invention. Typically, but not necessarily, network 100 is a single stage in a power amplifier system used, for instance, in a communications device, wherein the power amplifier system comprises a plurality of cascaded power amplifier networks like the one illustrated in FIG. 1. Network 100 signaling preferably anticipates both narrow bandwidth modulated signals and wide bandwidth modulated signals, such as, for example, a Frequency Division Multiple Access (FDMA) format and/or a Code Division Multiple Access (CDMA) format. In addition to comprising multiple modulation formats, the anticipated signaling environment of RF power amplifier network 100 is further characterized by input signals that exhibit a wide and dynamic range of input power levels (or amplitudes).

Referring back to FIG. 1, RF power amplifier network 100 includes an RF power amplifier having a plurality of operating performance characteristics responsive to a quiescent operating point. The RF power amplifier includes a transistor 110. Preferably, transistor 110 is a lateral double-diffused metal-oxide semiconductor (LDMOS) field effect transistor (FET) having its source coupled to a fixed voltage, preferably a ground potential. The RF power amplifier further comprises input port 112 for receiving the input signal, and, preferably, an input match circuit 114 coupled between input 112 and the gate of transistor 110 for effectively delivering the input power from a source load (not illustrated) to transistor 110. The RF power amplifier further comprises an output port 116 and, preferably, an output match circuit 118 coupled between output 116 and the drain of transistor 110 for effectively delivering the output power from transistor 110 to an output load (not illustrated). Preferably, transistor 110 is housed in an integrated circuit (IC) chip, but match circuits 114 and 118 may be either on-or off-chip.

RF power amplifier network 100 further includes an active self-bias compensation circuit according to the present invention. The bias compensation circuit comprises a transistor 120, a circuit 130, and, preferably, a circuit 122 and a circuit 150. Transistor 120 is also, preferably, an LDMOS FET having essentially the same electrical and thermal characteristics as transistor 110, which is accomplished by transistor 120 being housed on the same IC chip as transistor 110. Transistor 120 is preferably a fraction of the size of transistor 110, ideally 1/100 the size of transistor 110, to be most efficient in power consumption. The source of transistor 120 is coupled to a fixed voltage, preferably a ground potential. The gate of transistor 120 is coupled to circuit 150 and to the RF power. amplifier, preferably through circuit 122, and the drain of transistor 120 is coupled to circuit 130.

Referring again to circuits 122, 130 and ISO. Circuit 122 is preferably a resistor or an inductor. However, those of ordinary skill in the art will realize that circuit 122 may be some other, preferably, passive circuit that performs the same functionality. Circuit 130 is a voltage feedback circuit that preferably comprises resistors 132, 134 and 136 and a DC voltage source 138. Resistor 136 and voltage source 138 are coupled in series to the drain of transistor 120. Resistor 134 is coupled between the drain and gate of transistor 120, and resistor 132 is coupled between a ground potential and the junction of resistor 134 and the gate of transistor 120. Those of ordinary skill in the art will realize that circuit 130 may be of various configurations for performing the same functionality. Finally, circuit 150, preferably, comprises capacitors 152 and 154 coupled in parallel to a ground potential, but this circuit may be configured in other ways that provide for the needed functionality.

The active self-bias compensation circuit illustrated in FIG. 1 functions as follows. Prior to an input signal being received into the RF power amplifier input 112, circuit 130 is used to set a DC reference current, $I_{REF}$, into the drain of transistor 120. $I_{REF}$, in turn, causes a DC bias voltage, Vbias, to be coupled through circuit 122 to the gate of transistor 110 for setting the quiescent operating point of the RF power amplifier, which in the case of an LDMOS FET is established by a bias current, $I_{DQ}$, into the drain of transistor 110. The values of resistors 132, 134 and 136 and of voltage source 138 are initially selected, and fixed for the life of the RF power amplifier, to generate an $I_{DQ}$ that causes the RF power amplifier to be characterized in a particular class of operation. For instance, the RF power amplifier can be characterized as Class A. In that case, the values of resistors 132, 134 and 136 and of voltage source 138 are, preferably, selected to cause the RF power amplifier to operate with optimal linearity. The value of $I_{DQ}$ is a factor of the value of $I_{REF}$ and depends upon the relative size of transistors 110 and 120.

In order to maintain this optimal bias point once the RF power amplifier begins to process input signals, circuit 130 functions as a voltage feedback circuit for maintaining $I_{REF}$ at essentially a constant value independent of the gate threshold changes of transistors 110 and 120, which are due to changes in the transistor process and due to thermal effects. For instance, if the gate threshold voltage of transistor 110 changes, transistor 120 will accordingly exhibit the same changes since both transistors went through the same manufacturing process to cause both transistors to be housed on the same IC chip. A change in the gate threshold voltage of transistor 120 will cause $I_{REF}$ to correspondingly increase or decrease, depending on the nature of the gate threshold change, which will in turn cause a voltage change across resistor 134. Feedback circuit 130 will cause the voltage change across resistor 134 to be fed back into the gate of transistor 120 and will, thereby, change the biasing point of transistor 120 to maintain a constant and fixed reference current, $I_{REF}$.

Since the gate voltage of transistor 110,Vbias, is tied to the gate voltage of transistor 120, the changes to $I_{DQ}$ track the changes to $I_{REF}$, which causes $I_{DQ}$ to remain essentially constant independent of part changes and thermal effects. The key to this tracking is having both transistors 110 and 120 on the same IC chip so that their thermal and electrical characteristics are essentially the same independent of part changes and thermal effects. In addition, circuit 122 is also, preferably, included on the same IC chip with transistors 110 and 120. However, resistors 132, 134 and 136 and voltage source 138 are preferably located off-chip from transistors 110 and 120 for enabling a circuit designer to initially set the bias point of the RF power amplifier to the desired application using a terminal 139 and to allow the circuit designer access to the terminals of transistor 120 for proper bypassing in order to suppress a voltage build up on these terminals due to RF and baseband signals. Circuit 150 provides for gate terminal bypassing for transistor 120. Circuit 150 is also preferably located off-chip from transistors 110 and 120, and is coupled to these transistors via a port 140, because the need for high value capacitance for baseband bypassing is not realizable within the silicon process, on-chip.

Figure 2:
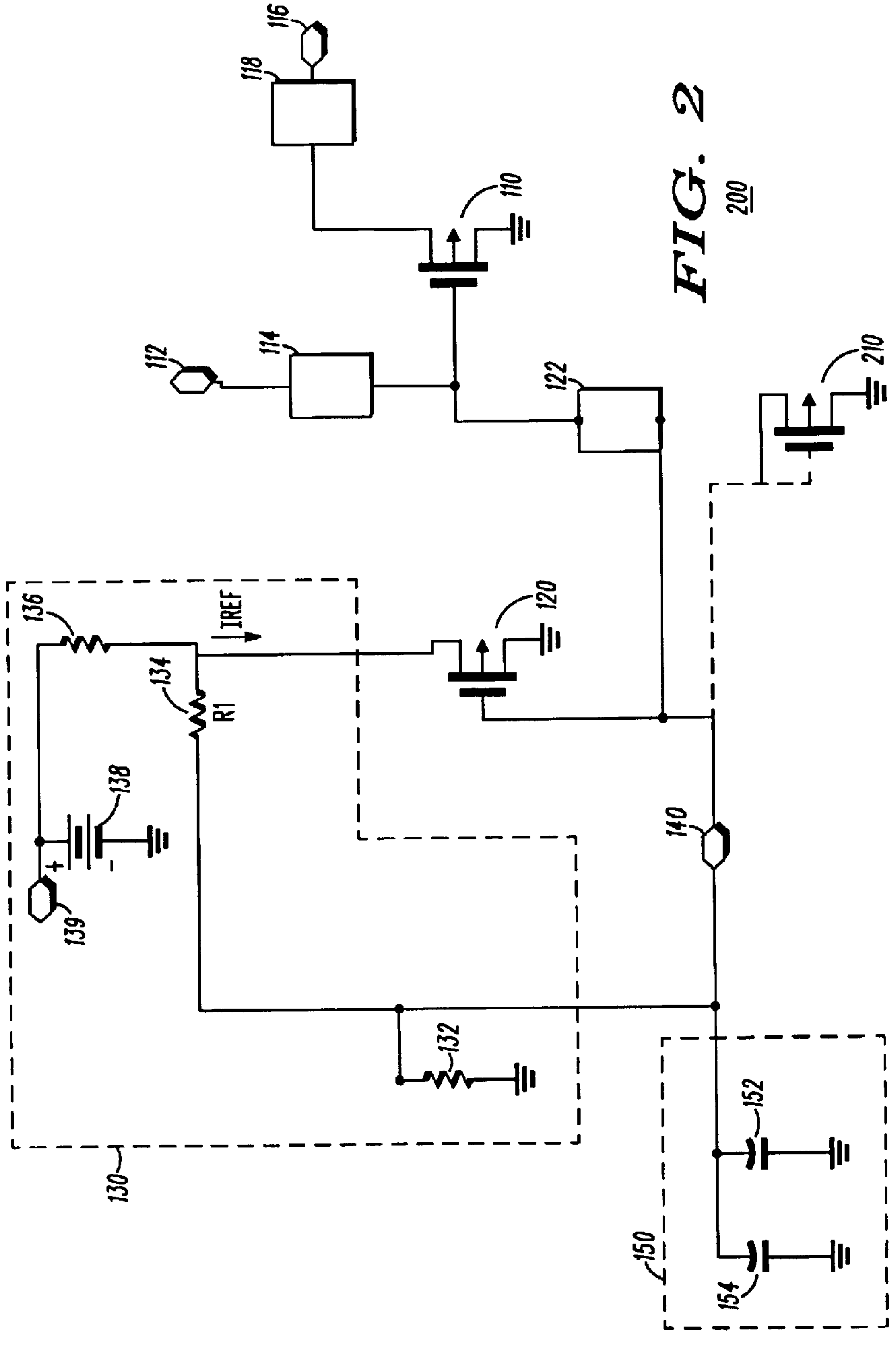
FIG. 2 illustrates a preferred embodiment of an RF power amplifier network in accordance with the present invention.

FIG. 2 illustrates a preferred embodiment of an RF power amplifier network 200 in accordance with the present invention. Network 200 in FIG. 2 is identical to and functions the same as network 100 in FIG. 1, except that the active self-bias compensation circuit of network 200 has an additional transistor 210 for added bias stabilization due to process and temperature changes. Transistor 210 is preferably an LDMOS FET that is configured to have essentially the same electrical and thermal characteristics as transistors 110 and 120, which is, preferably, accomplished by transistors 110, 120 and 210 being housed on the same IC chip. As can be seen in FIG. 2, the drain and gate of transistor 210 are connected together and further coupled to the gate of transistor 120 as well as to circuit 122, and the source of transistor 210 is coupled to a fixed voltage, preferably a ground potential. Transistor 210 is also preferably, but not necessarily, a fraction of the size of transistor 110, ideally 1/100 the size of transistor 110, to be most efficient in power consumption.

The addition of transistor 210 operates to minimize any variance that might exist between transistors 110 and 120. Those skilled in the art will realize that statistically it would be advantageous to have more than one self-bias compensation circuit on-chip and coupled to transistor 110 for better overall tracking of transistor 110. Having transistors 110, 120 and 210 on the same IC chip enables transistor 210 to add further stabilization to maintain the desired bias point fixed over temperature and process changes since transistor 210 tracks transistor 110 and appropriately change the bias voltage to the gate of transistor 110. The key to this tracking is that all three transistors are on the same IC chip such that their thermal and electrical characteristics are essentially the same independent of temperature and process variations.

One advantage of the present invention is that since the RF power amplifier network is self-biasing, it eliminates the need to factory tune each amplifier transistor.

Another advantage of the present invention is that it is simple, cost effective, space effective, and power effective.

Still another advantage of the present invention is that since the active selfbias compensation circuit is not fully integrated, it enables a circuit designer to have flexibility for optimizing the circuit to the desired application.

While the invention has been described in conjunction with specific embodiments thereof, additional advantages and modifications will readily occur to those skilled in the art. The invention, in its broader aspects, is therefore not limited to the specific details, representative apparatus, and illustrative examples shown and described. Various alterations, modifications and variations will be apparent to those skilled in the art in light of the foregoing description. For instance, those of ordinary skill in the art will realize that the present invention may be modified, wherein different types of transistors are used, including but not limited to Bipolar and Gallium Arsanide transistors, which also have a similar linearity versus bias behavior as LDMOS FETs. Thus, it should be understood that the invention is not limited by the foregoing description, but embraces all such alterations, modifications and variations in accordance with the spirit and scope of the appended claims.

What is claimed is:

1. An active self-bias compensation circuit for use with a radio frequency ("RF") power amplifier, said RF power amplifier having an input, an output, a first transistor, and a plurality of operating performance characteristics responsive to a quiescent operating point established by a bias current in the RF power amplifier, said active bias compensation circuit comprising:

a second transistor having a first, second and third terminal and configured to have essentially the same electrical and thermal characteristics as said first transistor, wherein the second terminal of said second transistor is operatively coupled to said RF power amplifier and the third terminal is coupled to a first fixed voltage; and a first circuit coupled between the first and second terminal of said second transistor for causing a reference current in said second transistor to be set and maintained at a first predetermined fixed value and for causing said bias current to be set and maintained at a second predetermined fixed value that is a factor of said first predetermined fixed value, said first circuit comprising a first, second and third resistor and a voltage source, said first resistor coupled between the first terminal of said second transistor and said voltage source, said second resistor coupled between the first and second terminals of said second transistor, and said third resistor coupled between a ground potential and the junction of said second resistor and the second terminal of said second transistor.

2. The active self-bias compensation circuit of claim 1, wherein said RF power amplifier is housed in an integrated circuit (IC) chip, and the second transistor is also housed in said IC chip for causing said first and second transistors to have essentially the same electrical and thermal characteristics.

3. The active self-bias compensation circuit of claim 1, wherein said first and second transistors are lateral double-diffused metal-oxide semiconductor (LDMOS) transistors.

4. The active self-bias compensation circuit of claim 3, said first and second transistors each having a first terminal that is a drain, a second terminal that is a gate, and a third terminal that is a source, wherein said reference current is the drain current of said second transistor, said bias current is the drain current of first transistor, and the gates of said first and second transistors are operatively coupled together for causing a bias voltage to be generated at the gate of said first transistor for setting and maintaining said bias current at said second predetermined fixed value.

5. The active self-bias compensation circuit of claim 1, wherein said first fixed voltage is a ground potential.

6. The active self-bias compensation circuit of claim 1 further comprising a second circuit coupled to the junction of said first circuit and the second terminal of said second transistor for suppressing a voltage build up on the second terminal of said second transistor due to RF and baseband signals.

7. An active self-bias compensation circuit for use with a radio frequency ("RF") power amplifier, said RF power amplifier having an input, an output, a first transistor, and a plurality of operating performance characteristics responsive to a quiescent operating point established by a bias current in the RF power amplifier, said active bias compensation circuit comprising:

a second transistor having a first, second and third terminal and configured to have essentially the same electrical and thermal characteristics as said first transistor, wherein the second terminal of said second transistor is operatively coupled to said RF power amplifier and the third terminal is coupled to a first fixed voltage;

a first circuit coupled between the first and second terminal of said second transistor for causing a reference current in said second transistor to be set and maintained at a first predetermined fixed value and for causing said bias current to be set and maintained at a second predetermined fixed value that is a factor of said first predetermined fixed value; and a second circuit coupled to the junction of said first circuit and the second terminal of said second transistor for suppressing a voltage build up on the second terminal of said second transistor due to RF and baseband signals, said second circuit comprising a first and second capacitor coupled in parallel between a ground potential and the junction of said first circuit and the second terminal of said second transistor.

8. The active self-bias compensation circuit of claim 1 further comprising a third transistor having a first, second and third terminal and configured to have essentially the same electrical and thermal characteristics as said first and second transistors, wherein said first and second terminal are connected together and further coupled to the junction of said RF power amplifier and the second terminal of said second transistor, and the third terminal of said third transistor is coupled to a ground potential for enabling said bias current to be maintained at said second predetermined fixed value independent of a temperature variation of said RF power amplifier.

9. The active self-bias compensation circuit of claim 1, further comprising a second circuit for coupling said RF power amplifier to the second terminal of said second transistor.

10. The active self-bias compensation circuit of claim 9, wherein said second circuit comprise a resistor coupled between said RF power amplifier and the second terminal of said second transistor.

11. The active self-bias compensation circuit of claim 9, wherein said second circuit comprise a resistor coupled between said RF power amplifier and the second terminal said second transistor.

12. An active self-bias compensation circuit for use with a radio frequency ("RF") power amplifier, said RF power amplifier having an input, an output, a first transistor, and a plurality of operating performance characteristics responsive to a quiescent operating point established by a bias current in the RF power amplifier, said active bias compensation circuit comprising:

a second transistor having a first, second and third terminal and configured to have essentially the same electrical and thermal characteristics as said first transistor, wherein the second terminal of said second transistor is operatively coupled to said RF power amplifier and the third terminal is coupled to a first fixed voltage;

a first circuit coupled between the first and second terminal of said second transistor for causing a reference current in said second transistor to be set and maintained at a first predetermined fixed value and for causing said bias current to be set and maintained at a second predetermined fixed value that is a factor of said first predetermined fixed value, said first circuit comprising a first, second and third resistor and a voltage source, said first resistor coupled between the first terminal of said second transistor and said voltage source, said second resistor coupled between the first and second terminals of said second transistor, and said third resistor coupled between a ground potential and the junction of said second resistor and the second terminal of said second transistor;

a second circuit coupled to the junction of said first circuit and the second terminal of said second transistor for suppressing a voltage build up on the second terminal of said second transistor due to RF and baseband signals, said second circuit comprising a first and second capacitor coupled in parallel between a ground potential and the junction of said first circuit and the second terminal of said second transistor; and a third transistor having a first, second and third terminal and configured to have essentially the same electrical and thermal characteristics as said first transistor, wherein the first and second terminals of said third transistor are connected together and further coupled to the junction of said RF power amplifier and the second terminal of said second transistor, and the third terminal of said third transistor is coupled to a ground potential for enabling said bias current to be maintained at said second predetermined fixed value independent of a temperature variation of said RF power amplifier.

13. A radio frequency ("RF") power amplifier network for use in a communications device comprising:

an RF power amplifier characterized by a plurality of operating performance characteristics responsive to a quiescent operating point established by a bias current in the RF power amplifier, said RF power amplifier comprising an input, an output, and a first transistor coupled between said input and said output; and an active self-bias compensation circuit comprising a second transistor having a first, second and third terminal and configured to have essentially the same electrical and thermal characteristics as said first transistor, wherein the second terminal of said second transistor is operatively coupled to said RF power amplifier and the third terminal is coupled to a first fixed voltage, said active bias compensation circuit further comprising a first circuit coupled between the first and second terminal of said second transistor for causing a reference current in said second transistor to be set and maintained at a first predetermined fixed value and for causing said bias current to be set and maintained at a second predetermined fixed value that is a factor of said first predetermined fixed value, said first circuit comprising a first, second and third resistor and a voltage source, said first resistor coupled between the first terminal of said second transistor and said voltage source, said second resistor coupled between the first and second terminals of said second transistor, and said third resistor coupled between a ground potential and the function of said second resistor and the second terminal of said second transistor.

* * * * *

UNITED STATES PATENT AND TRADEMARK OFFICE

CERTIFICATE OF CORRECTION

PATENT NO. : 6,774,724 B2
DATED : August 10, 2004
INVENTOR(S) : Krvavac, Enver

It is certified that error appears in the above-identified patent and that said Letters Patent is hereby corrected as shown below:

Column 6,
Line 67, change "comprise" to -- comprises --.

Column 7,
Line 4, change "comprise" to -- comprises --.

Column 13,
Line 41, change "function" to -- junction --.

Signed and Sealed this

Fourth Day of October, 2005

JON W. DUDAS
*Director of the United States Patent and Trademark Office*